US012666758B2

(12) United States Patent
Cheng et al.

(10) Patent No.: US 12,666,758 B2
(45) Date of Patent: Jun. 23, 2026

(54) ULTRAVIOLET LED AND MANUFACTURING METHOD THEREOF

(71) Applicant: ENKRIS SEMICONDUCTOR, INC., Suzhou (CN)

(72) Inventors: Kai Cheng, Suzhou (CN); Zhuan Liu, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 732 days.

(21) Appl. No.: 17/802,107

(22) PCT Filed: May 13, 2020

(86) PCT No.: PCT/CN2020/089999
§ 371 (c)(1),
(2) Date: Aug. 24, 2022

(87) PCT Pub. No.: WO2021/226867
PCT Pub. Date: Nov. 18, 2021

(65) Prior Publication Data
US 2023/0080225 A1 Mar. 16, 2023

(51) Int. Cl.
*H10H 20/812* (2025.01)
*H10H 20/01* (2025.01)
(Continued)

(52) U.S. Cl.
CPC ...... *H10H 20/812* (2025.01); *H10H 20/0137* (2025.01); *H10H 20/816* (2025.01); *H10H 20/825* (2025.01)

(58) Field of Classification Search
CPC .............. H01L 33/0025; H01L 33/0075; H01L 33/145; H01L 33/14; H01L 33/30;
(Continued)

(56) References Cited

U.S. PATENT DOCUMENTS 6,577,006 B1 6/2003 Kiyoshi et al.
2012/0217473 A1* 8/2012 Shur ...................... H01L 33/06
257/E33.048
(Continued)

FOREIGN PATENT DOCUMENTS

CN 104966768 A 10/2015
CN 106025007 A * 10/2016 ......... H01L 33/0075
(Continued)

OTHER PUBLICATIONS

Chen_English, chen translation (Year: 2016).*
(Continued)

*Primary Examiner* — Minsun O Harvey
*Assistant Examiner* — Alexander Ehrlich
(74) *Attorney, Agent, or Firm* — Carroll, Hoette & Butscher, LLC; Christopher R. Carroll

(57) ABSTRACT

This application provides an ultraviolet LED and a manufacturing method thereof. In the manufacturing method, an N-type transition layer is formed above an electron supply layer and/or a P-type transition layer is formed above a hole supply layer, materials of the electron supply layer and the hole supply layer include at least three elements: Al, Ga and N, and materials of the N-type transition layer and the P-type transition layer are GaN; an N electrode is formed on the N-type transition layer, and an ohmic contact is formed between the N-type transition layer and the N electrode; a P electrode is formed on the P-type transition layer, and an ohmic contact is formed between the P-type transition layer and the P electrode.

20 Claims, 7 Drawing Sheets

(51) Int. Cl.
    *H10H 20/816*      (2025.01)
    *H10H 20/825*      (2025.01)

(58) Field of Classification Search
    CPC ......... H01L 33/32; H01L 33/36; H01L 33/44;
              H01L 33/06; H01L 33/04; H01L 2933/00
    See application file for complete search history.

(56)             References Cited

U.S. PATENT DOCUMENTS

| | | | |
|---|---|---|---|
| 2013/0256630 A1 | 10/2013 | Han et al. | |
| 2019/0103509 A1* | 4/2019 | Lachab | .................. H01L 29/00 |

FOREIGN PATENT DOCUMENTS

| | | | | |
|---|---|---|---|---|
| CN | 107146840 A | * | 9/2017 | |
| CN | 110808320 A | | 2/2020 | |
| CN | 110890447 A | * | 3/2020 | ....... H10H 20/01335 |
| JP | 2000252230 A | | 9/2000 | |
| JP | 2002280610 A | | 9/2002 | |
| WO | 2018035322 A1 | | 2/2018 | |

OTHER PUBLICATIONS

Wang_English1, wang translation (Year: 2017).*

Xu_English, xu translation (Year: 2020).*

ISA State Intellectual Property Office of the People's Republic of China, International Search Report Issued in Application No. PCT/CN2020/089999, Feb. 3, 2021, WIPO, 4 pages.

ISA State Intellectual Property Office of the People's Republic of China, Written Opinion of the International Searching Authority Issued in Application No. PCT/CN2020/089999, Feb. 3, 2021, WIPO, 6 pages. (Submitted with Machine/Partial Translation).

TW Patent Office, Office Action Issued in Application No. 110117146, Dec. 21, 2021, 11 pages. (Submitted with Machine/Partial Translation).

TW Patent Office, Decision of Rejection Issued in Application No. 110117146, Apr. 20, 2022, 16 pages. (Submitted with Machine/Partial Translation).

State Intellectual Property Office of the People's Republic of China, Office Action and Search Report Issued in Application No. 2020800975344, Jan. 24, 2025, 19 pages.(Submitted with Machine Translation).

Qi Changya et al., "Effect of secondary annealing on the microstructure of Au/Ni/Au/Ni/p-AlGaN ohmic contact", Journal of Optoelectronics•Laser, vol. 27 No. 4, Apr. 2016, 6 pages.

* cited by examiner

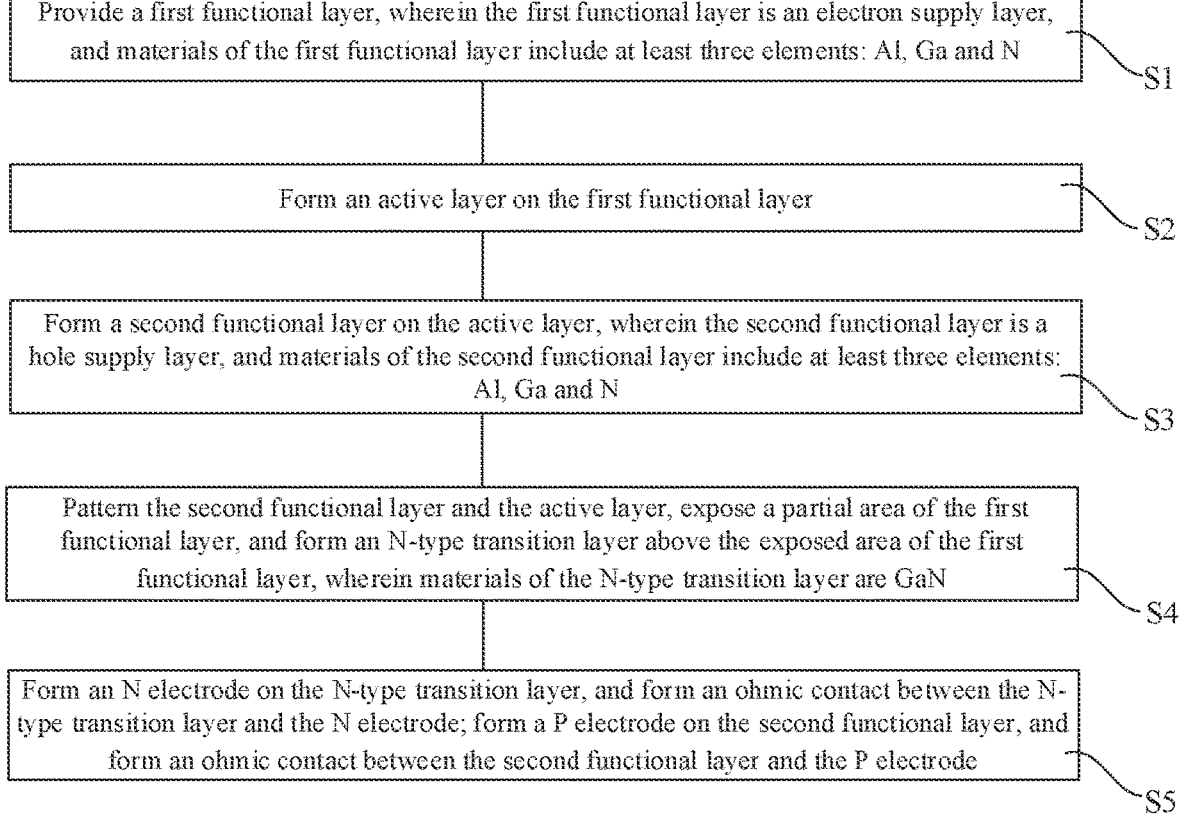

Provide a first functional layer, wherein the first functional layer is an electron supply layer, and materials of the first functional layer include at least three elements: Al, Ga and N ⎯S1

Form an active layer on the first functional layer ⎯S2

Form a second functional layer on the active layer, wherein the second functional layer is a hole supply layer, and materials of the second functional layer include at least three elements: Al, Ga and N ⎯S3

Pattern the second functional layer and the active layer, expose a partial area of the first functional layer, and form an N-type transition layer above the exposed area of the first functional layer, wherein materials of the N-type transition layer are GaN ⎯S4

Form an N electrode on the N-type transition layer, and form an ohmic contact between the N-type transition layer and the N electrode; form a P electrode on the second functional layer, and form an ohmic contact between the second functional layer and the P electrode ⎯S5

FIG.1

ULTRAVIOLET LED AND MANUFACTURING METHOD THEREOF

CROSS-REFERENCE TO RELATED APPLICATIONS

This application is a national phase entry of and claims priority to International Patent Application No. PCT/CN2020/089999 (filed 13 May 2020), the entire disclosure of which is incorporated herein by reference.

TECHNICAL FIELD

The present application relates to the field of semiconductor technology, and in particular, to an ultraviolet LED and a manufacturing method thereof.

BACKGROUND

Ultraviolet (UV) light is classified into: UVC (ultraviolet light with wavelength <280 nm), UVB (ultraviolet light with 280 nm≤wavelength≤315 nm), and UVA (ultraviolet light with 315 nm≤wavelength≤400 nm). The main uses of UVA include ultraviolet curing, document and banknote identification. UVB is mainly used in medical, printing, and air fresheners using a photocatalyst, etc. UVC is mainly used in sterilization, biochemical testing, high-density information storage, military secure communication or other fields. Because ultraviolet LEDs (light-emitting diodes) have merits of energy saving, environmental protection, light weight, spectrum purity, safety, no mercury pollution, etc., they can replace traditional mercury-containing ultraviolet light sources for application. A luminous wavelength of an ultraviolet LED of which an active area is made of materials $Al_xGa_{1-x}N$ (0≤x≤1), covers an ultraviolet band from 210 nm to 365 nm (called short-wavelength ultraviolet), and therefore, the materials $Al_xGa_{1-x}N$ are ideal materials for manufacturing ultraviolet LED device products in this band.

Existing $Al_xGa_{1-x}N$-based ultraviolet LEDs with a wavelength less than 280 nm have low luminous efficiency.

SUMMARY

An objective of the present disclosure is to provide an ultraviolet LED and a manufacturing method thereof.

In order to achieve the above objective, a first aspect of the present disclosure provides an ultraviolet LED, including:

an electron supply layer, a hole supply layer, and an active layer between the electron supply layer and the hole supply layer, and at least one of an N-type transition layer above the electron supply layer or a P-type transition layer above the hole supply layer; wherein materials of the electron supply layer and the hole supply layer include at least three elements: Al, Ga and N; materials of the N-type transition layer and the P-type transition layer comprise GaN; an N electrode is provided above the N-type transition layer; an ohmic contact is formed between the N-type transition layer and the N electrode; a P electrode is provided above the P-type transition layer; and an ohmic contact is formed between the P-type transition layer and the P electrode.

Optionally, when the N-type transition layer is provided above the electron supply layer, an N-type graded material layer is provided between the electron supply layer and the N-type transition layer, wherein the N-type graded material layer comprises at least three elements: Al, Ga and N, and a mass percentage of the Ga in the N-type graded material layer is greater than a mass percentage of the Ga in the electron supply layer;

when the P-type transition layer is provided above the hole supply layer, a P-type graded material layer is provided between the hole supply layer and the P-type transition layer, wherein the P-type graded material layer comprises at least three elements: Al, Ga and N, and a mass percentage of the Ga in the P-type graded material layer is greater than a mass percentage of the Ga in the hole supply layer.

Optionally, the ultraviolet LED further includes at least one of: the N-type transition layer is a heavily doped N-type GaN layer, or the P-type transition layer is a heavily doped P-type GaN layer.

Optionally, the material of at least one of the electron supply layer or the hole supply layer is AlGaN.

Optionally, the active layer includes a quantum well structure.

Optionally, the quantum well structure is a multiple quantum well structure.

Optionally, the quantum well structure includes an $Al_xGa_{1-x}N$ layer and an $Al_yGa_{1-y}N$ layer, wherein 1≥x≥0, and 1≥y≥0.

Optionally, the hole supply layer and the active layer have an electron blocking layer therebetween.

Optionally, material of at least one of the N electrode or the P electrode is at least one of Ti, Al, Ni or Au.

Optionally, a mask layer is provided above the electron supply layer and the hole supply layer, wherein the mask layer is made of an insulating material, and an area covered by the mask layer which is complementary to an area covered by the N-type transition layer or the P-type transition layer.

A second aspect of the present disclosure provides a method of manufacturing an ultraviolet LED, including:

providing a first functional layer, wherein the first functional layer is one of an electron supply layer and a hole supply layer, and materials of the first functional layer include at least three elements: Al, Ga and N;

forming an active layer above the first functional layer;

forming a second functional layer above the active layer, wherein the second functional layer is another of the electron supply layer and the hole supply layer, and materials of the second functional layer include at least three elements: Al, Ga and N;

patterning the second functional layer and the active layer, exposing a partial area of the first functional layer, and forming a transition layer above at least one of the second functional layer or the exposed area of the first functional layer, wherein a transition layer above the electron supply layer is an N-type transition layer, a transition layer above the hole supply layer is a P-type transition layer, and materials of the N-type transition layer and the P-type transition layer are GaN;

forming an N electrode above the N-type transition layer, forming an ohmic contact between the N-type transition layer and the N electrode; forming a P electrode above the P-type transition layer, and forming an ohmic contact between the P-type transition layer and the P electrode.

Optionally, the method further includes at least one of: before the N-type transition layer is formed above the electron supply layer, an N-type graded material layer is formed firstly, the N-type graded material layer includes at least three elements: Al, Ga and N, and a mass percentage of the Ga in the N-type graded material layer is greater than a mass percentage of the Ga in the electron supply layer; or before the P-type transition layer is formed above the hole supply layer, a P-type graded material layer is formed firstly, the P-type graded material layer includes at least three elements: Al, Ga and N, and a mass percentage of the Ga in the P-type graded material layer is greater than a mass percentage of the Ga in the hole supply layer.

Optionally, the N-type transition layer is a heavily doped N-type GaN layer, and/or the P-type transition layer is a heavily doped P-type GaN layer.

Optionally, before the transition layer is formed above at least one of the second functional layer or the exposed area of the first functional layer, a mask layer is formed above the second functional layer and the exposed area of the first functional layer, the mask layer is made of an insulating material, and an area covered by the mask layer which is complementary to an area covered by a to-be-formed transition layer.

Optionally, the material of at least one of the electron supply layer or the hole supply layer is AlGaN.

Optionally, the active layer includes a quantum well structure.

Optionally, the quantum well structure is a multiple quantum well structure.

Optionally, the quantum well structure includes an $Al_xGa_{1-x}N$ layer and an $Al_yGa_{1-y}N$ layer, wherein $1 \geq x \geq 0$, and $1 \geq y \geq 0$.

Optionally, the hole supply layer and the active layer have an electron blocking layer therebetween.

Optionally, material of at least one of the N electrode or the P electrode is at least one of Ti, Al, Ni or Au.

BRIEF DESCRIPTION OF THE DRAWINGS

FIG. 1 is a flowchart illustrating a method of manufacturing an ultraviolet LED according to a first embodiment of the present disclosure.

Figure 2:
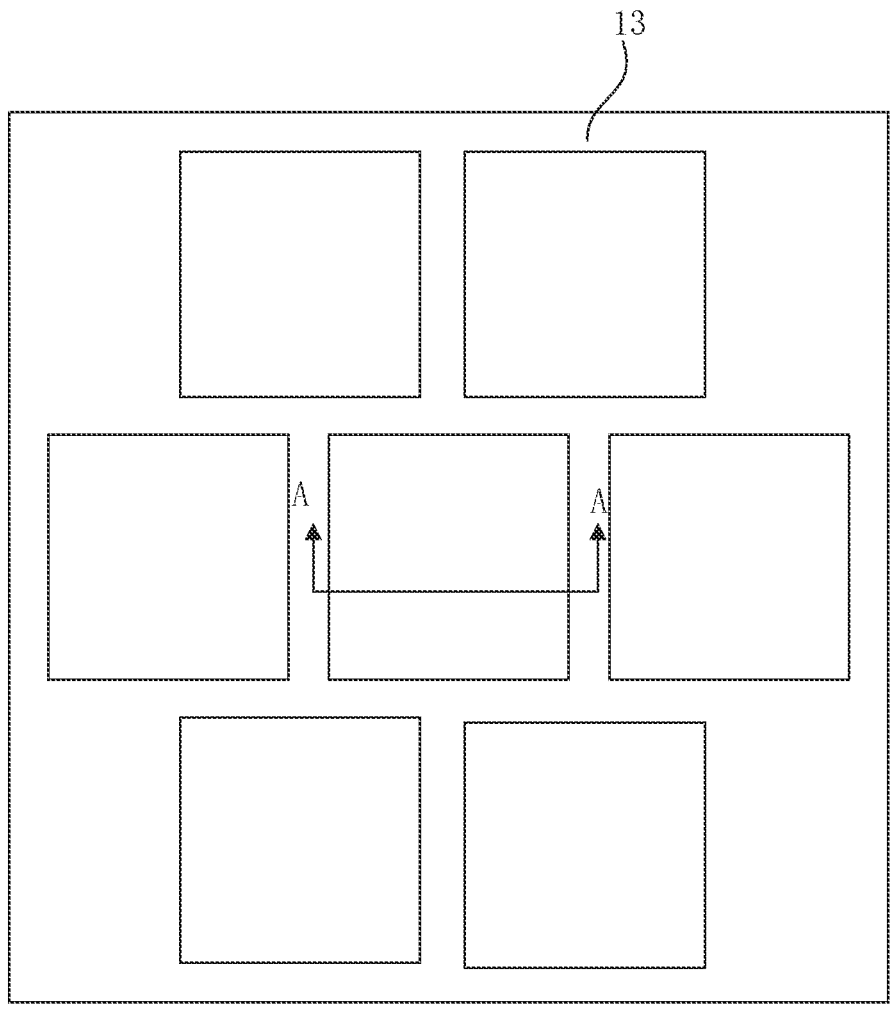
FIGS. 2 to 6 are schematic diagrams illustrating intermediate structures corresponding to the process in FIG. 1.

To facilitate the understanding of the present disclosure, all reference signs appearing in the present disclosure are listed below:

Substrate 100
Electron supply layer 11
Active layer 12
Hole supply layer 13
N-type transition layer 141
P-type transition layer 142
N electrode 151
P electrode 152
N-type graded material layer 161
P-type graded material layer 162
Heavily doped N-type GaN layer 141'
Electron blocking layer 17
Heavily doped P-type GaN layer 142'
Mask layer 18
Ultraviolet LEDs 1, 2, 3, 4, 5, 6, 7, 8, 9, 10

DETAILED DESCRIPTION OF THE EMBODIMENTS

In order to make the above objectives, features and advantages of the present disclosure more apparent and understandable, particular embodiments of the present disclosure will be described in detail below with reference to the accompanying drawings.

FIG. 1 is a flowchart illustrating a method of manufacturing an ultraviolet LED according to a first embodiment of the present disclosure. FIGS. 2 to 6 are schematic diagrams illustrating intermediate structures corresponding to the process in FIG. 1. FIG. 7 is a schematic diagram illustrating a cross-sectional structure of the ultraviolet LED manufactured according to the flows in FIG. 1.

Figure 3:
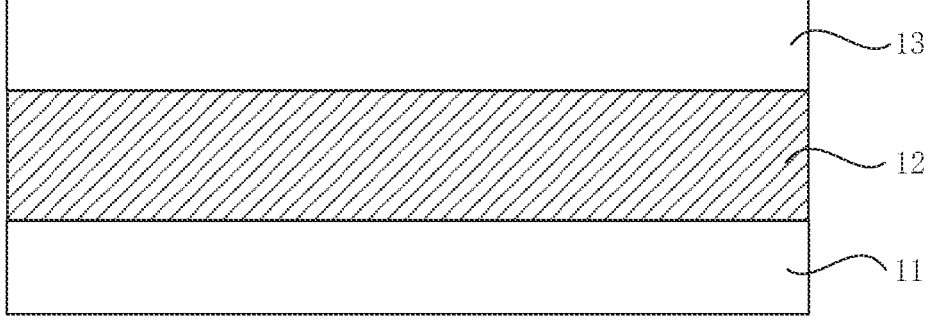

Firstly, referring to step S1 in FIG. 1 and FIGS. 2 to 3, a first functional layer is provided. The first functional layer is an electron supply layer 11. Materials of the electron supply layer 11 include at least three elements: Al, Ga and N. FIG. 3 is a sectional view taken along line AA in FIG. 2.

The electron supply layer 11 may be an N-type semiconductor such as an N-type III-V compound. N-type doping elements may include at least one of Si, Ge, Sn, Se or Te. In some embodiments, the materials of the electron supply layer 11 include AlGaN, that is, include only the three elements: Al, Ga and N. More particularly, the ratio of the three elements: Al, Ga and N is not limited, that is, its materials are $Al_mGa_{1-m}N$, where m is a mass percentage of Al in a sum of masses of Al and Ga, and $1 > m > 0$. In some embodiments, in addition to the three elements: Al, Ga and N, the materials of the electron supply layer 11 may include In, P and other elements.

The electron supply layer 11 may include one or more layers.

Next, referring to step S2 in FIG. 1 and FIGS. 2 to 3, an active layer 12 is formed on the first functional layer.

The active layer 12 may include at least one of a single quantum well structure, a multiple quantum well (MQW) structure, a quantum wire structure or a quantum dot structure.

The active layer 12 may include a well layer and a barrier layer formed of a GaN-based semiconductor material.

For example, the well layer may include an $Al_xGa_{1-x}N$ layer, where x is a mass percentage of Al in a sum of masses of Al and Ga, and $1 \geq x \geq 0$; and/or the barrier layer may include an $Al_yGa_{1-y}N$ layer, where y is a mass percentage of Al in a sum of masses of Al and Ga, and $1 \geq y \geq 0$. A band gap of the well layer is smaller than a band gap of the barrier layer.

Processes for forming the well layer and/or the barrier layer may include: Atomic Layer Deposition (ALD), or Chemical Vapor Deposition (CVD), or Molecular Beam Epitaxy (MBE), or Plasma Enhanced Chemical Vapor Deposition (PECVD), or Low Pressure Chemical Vapor Deposition (LPCVD), or Metal-Organic Chemical Vapor Deposition (MOCVD), or a combination thereof.

The well layer and/or the barrier layer may be doped or not doped with Al. Being not doped with Al may improve their crystal quality, but being doped with Al may reduce their resistance.

Alternating well layers and barrier layers may form a multiple quantum well structure to further improve luminous efficiency.

Next, referring to step S3 in FIG. 1 and FIGS. 2 to 3, a second functional layer is formed on the active layer 12. The second functional layer is a hole supply layer 13. Materials of the second functional layer include at least three elements: Al, Ga and N.

The hole supply layer 13 may be a P-type semiconductor such as a P-type III-V compound. P-type doping elements may include at least one of Mg, Zn, Ca, Sr or Ba. In some embodiments, the materials of the hole supply layer 13 include AlGaN, that is, include only the three elements: Al, Ga and N. More particularly, the ratio of the three elements: Al, Ga and N is not limited, that is, its materials are $Al_nGa_{1-n}N$, where n is a mass percentage of Al in a sum of masses of Al and Ga, and $1 > n > 0$. In some embodiments, in addition to the three elements: Al, Ga and N, the materials of the hole supply layer 13 may include In, P and other elements.

The hole supply layer 13 may include one or more layers.

Then, referring to step S4 in FIG. 1 and FIGS. 4 to 6, the second functional layer and the active layer 12 are patterned, a partial area of the first functional layer is exposed, an N-type transition layer 141 is formed above the exposed area of the first functional layer, and a material of the N-type transition layer 141 is GaN.

Figure 4:
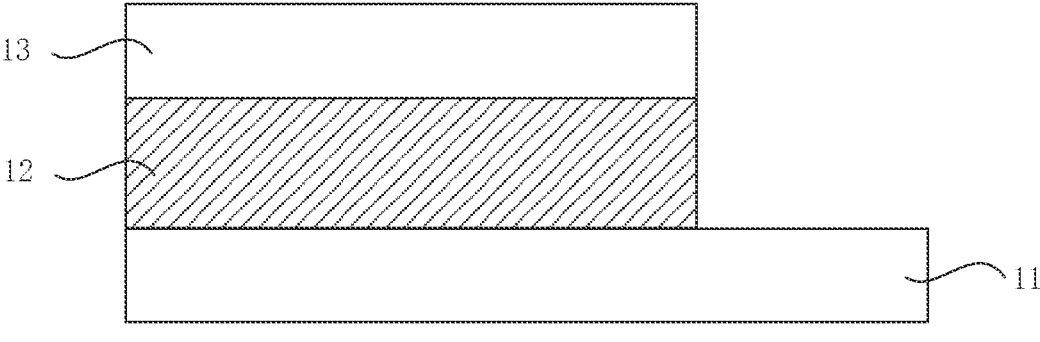

Referring to FIG. 4, patterning the second functional layer and the active layer 12 may include: first forming a photoresist mask layer on the second functional layer; then exposing the photoresist mask layer to develop a photoresist pattern; and dry-etching or wet-etching the second functional layer and the active layer 12 using the photoresist pattern.

In some examples before forming the photoresist mask layer, a glue removal solution (dimethyl sulfoxide) may be used to clean intermediate structures shown in FIGS. 2 to 3 in an ultrasonic state at 70° C. to 100° C. to remove organic particles on the surface; and $H_2SO_4:H_2O_2:H_2O$ (5:1:1) may be used to clean at 80° C. to 90° C. to remove metal particles and the oxide layer on the surface;

Next, a surface of the second functional layer is coated with a tackifier HMDS (Hexamethyl Disilazane) to change the surface of the second functional layer from hydrophilicity to hydrophobicity.

After the etching is implemented, the remaining photoresist pattern may be removed by ashing.

Figure 5:
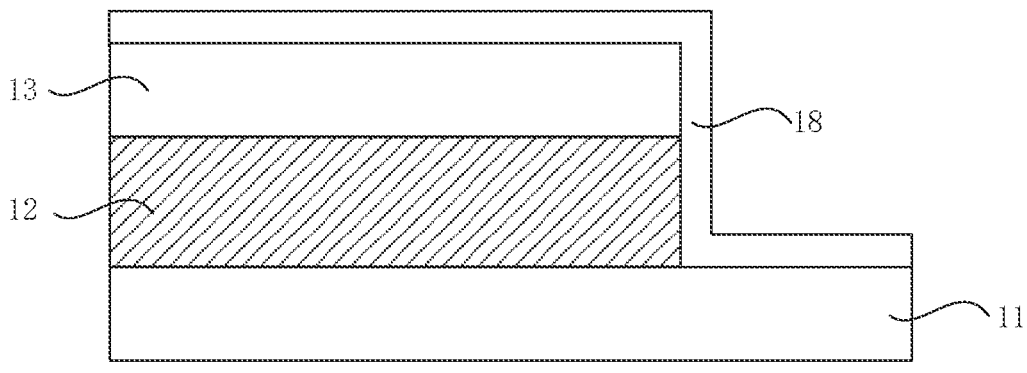

Referring to FIG. 5, after the second functional layer and the active layer 12 are patterned, a mask layer 18 may be formed on the second functional layer and the exposed area of the first functional layer.

The mask layer 18 may be made of an insulating material such as silicon dioxide and silicon nitride, and the layer may be formed with a uniform thickness using physical vapor deposition or chemical vapor deposition.

Figure 6:
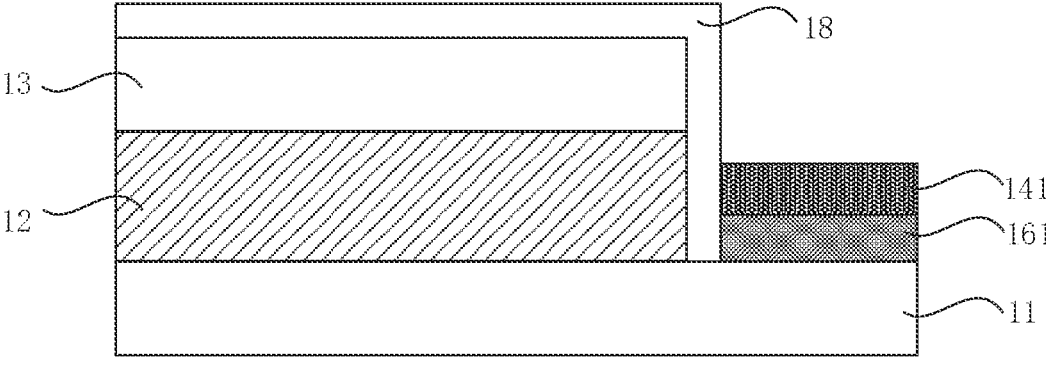
Figure 7:
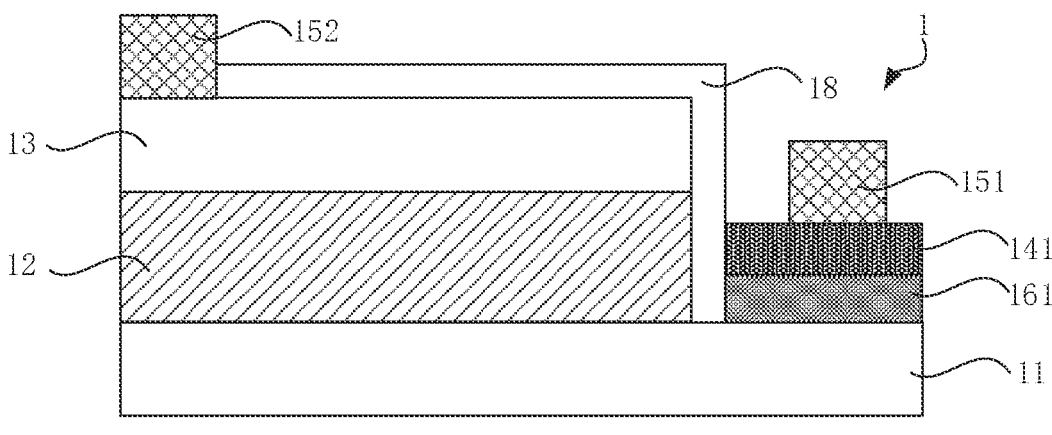
FIG. 7 is a schematic diagram illustrating a cross-sectional structure of the ultraviolet LED manufactured according to the process in FIG. 1.

Referring to FIG. 6, the mask layer 18 is patterned. The mask layer 18 in an area covered by a to-be-formed N-type transition layer 141 is removed. The remaining mask layer 18 may prevent the N-type transition layer 141 manufactured in the subsequent process from being formed thereon. In other words, an area covered by the remaining mask layer 18 needs to be complementary to the area covered by the to-be-formed N-type transition layer 141.

Processes for forming the N-type transition layer 141 may refer to the processes for forming the well layer and/or the barrier layer.

Referring to FIG. 6, in order to improve the quality of the N-type transition layer 141, an N-type graded material layer 161 may also be firstly formed on the exposed area of the first functional layer. Materials of the N-type graded material layer 161 may be $Al_tGa_{1-t}N$, where t is a mass percentage of Al in a sum of masses of Al and Ga, and $m > t > 0$. That is, a mass percentage of Ga in the N-type graded material layer 161 is between a mass percentage of Ga in the first functional layer and a mass percentage of Ga in the N-type transition layer 141. In the N-type graded material layer 161, in a thickness direction from the first functional layer to the N-type transition layer 141, the mass percentage of Ga may be gradually increased.

According to the materials of the first functional layer, in addition to the three elements: Al, Ga and N, materials of the N-type graded material layer 161 may include In, P and other elements.

Processes for forming the N-type graded material layer 161 may refer to the processes for forming the well layer and/or the barrier layer.

Next, referring to step S5 in FIG. 1 and FIG. 7, an N electrode 151 is formed on the N-type transition layer 141, and an ohmic contact is formed between the N-type transition layer 141 and the N electrode 151; a P electrode 152 is formed on the second functional layer, and between the second functional layer and the P electrode 152 is an ohmic contact.

As shown in FIG. 7, materials of the N electrode 151 and the P electrode 152 may be at least one of Ti, Al, Ni or Au. For example, the N electrode 151 and the P electrode 152 have a stacked structure of Ti layer/Al layer/Ni layer/Au layer, or a stacked structure of Ti layer/Al layer, or a stacked structure of Ni layer/Au layer, which may be formed by sputtering.

In some embodiments, the P electrode 152 on a surface of the second functional layer and the N electrode 151 on a surface of the N-type transition layer 141 may be sputtered in the same process. At this time, before the P electrode 152 is formed, the mask layer 18 in a partial area of the surface of the second functional layer is removed. The P electrode 152 on the surface of the second functional layer needs to be annealed at a high temperature to form a P-type ohmic contact.

In some embodiments, the P electrode 152 on the surface of the second functional layer may be sputtered before or after the N electrode 151 on the surface of the N-type transition layer 141 is formed.

Since the materials of the N-type transition layer 141 are GaN, a low contact resistance may be formed between the N electrode 151 and the N-type transition layer 141 without annealing. In addition, the electron supply layer 11 does not need to be made too thick, so that the quality of the electron supply layer 11 may be improved.

In the method of manufacturing an ultraviolet LED according to this embodiment, the N-type transition layer 141 is formed above the electron supply layer 11, the materials of the electron supply layer 11 include at least three elements: Al, Ga and N, and the materials of the N-type transition layer 141 are GaN; the N electrode 151 is formed on the N-type transition layer 141, and an ohmic contact is formed between the N-type transition layer 141 and the N electrode 151. Compared with directly forming the N electrode 151 on an aluminum-containing GaN-based material and then forming an ohmic contact by post-annealing at a high temperature, annealing can be avoided, as well as the degradation of performance of the electron supply layer 11 and the reduction of the electron-hole recombination rate in the active layer 12 caused by the high temperature during the annealing can be avoided. Therefore, the luminous efficiency of an ultraviolet LED 1 may be improved.

Referring to FIG. 7, the ultraviolet LED 1 according to the first embodiment of the present disclosure includes:

an electron supply layer 11, a hole supply layer 13, and an active layer 12 between the electron supply layer 11 and the hole supply layer 13. Materials of the electron supply layer 11 and the hole supply layer 13 include at least three elements: Al, Ga and N. An N-type transition layer 141 is provided above the electron supply layer 11. Materials of the N-type transition layer 141 are GaN. An N electrode 151 is provided on the N-type transition layer 141. An ohmic contact is formed between the N-type transition layer 141 and the N electrode 151. A P electrode 152 is provided on the hole supply layer 13. Between the hole supply layer 13 and the P electrode 152 is an ohmic contact.

The electron supply layer 11 may include one or more layers. The electron supply layer 11 may be an N-type semiconductor such as an N-type III-V compound. N-type doping elements may include at least one of Si, Ge, Sn, Se or Te. In some embodiments, the materials of the electron supply layer 11 include AlGaN, that is, include only the three elements: Al, Ga and N. More particularly, the ratio of the three elements: Al, Ga and N is not limited, that is, its materials are $Al_mGa_{1-m}N$, where m is a mass percentage of Al in a sum of masses of Al and Ga, and 1>m>0. In some embodiments, in addition to the three elements: Al, Ga and N, the materials of the electron supply layer 11 may include In, P and other elements.

The active layer 12 may include at least one of a single quantum well structure, a multiple quantum well (MQW) structure, a quantum wire structure or a quantum dot structure. The active layer 12 may include a well layer and a barrier layer formed of a GaN-based semiconductor material.

For example, the well layer may include an $Al_xGa_{1-x}N$ layer, where x is a mass percentage of Al in a sum of masses of Al and Ga, and 1≥x≥0; and/or the barrier layer may include an $Al_yGa_{1-y}N$ layer, where y is a mass percentage of Al in a sum of masses of Al and Ga, and 1≥y≥0. A band gap of the well layer is smaller than a band gap of the barrier layer. The well layer and/or the barrier layer may be doped or not doped with Al.

Alternating well layers and barrier layers may form a multiple quantum well structure.

The hole supply layer 13 may include one or more layers. The hole supply layer 13 may be a P-type semiconductor such as a P-type III-V compound. P-type doping elements may include at least one of Mg, Zn, Ca, Sr or Ba. In some embodiments, the materials of the hole supply layer 13 include AlGaN, that is, include only the three elements: Al, Ga and N. More particularly, the ratio of the three elements: Al, Ga and N is not limited, that is, its materials are $Al_nGa_{1-n}N$, where n is a mass percentage of Al in a sum of masses of Al and Ga, and 1>n>0. In some embodiments, the materials of the hole supply layer 13 may include In, P and other elements in addition to the three elements: Al, Ga and N.

An upper surface of the hole supply layer 13, side surfaces of the hole supply layer 13 and the active layer 12, and an upper surface of the electron supply layer 11 may have a mask layer 18. An area covered by the mask layer 18 which is complementary to an area covered by the N-type transition layer 141. The mask layer 18 may be made of an insulating material.

An N-type graded material layer 161 may be provided between the electron supply layer 11 and the N-type transition layer 141. Materials of the N-type graded material layer 161 may be $Al_tGa_{1-t}N$, where t is a mass percentage of Al to in sum of masses of Al and Ga, and m>t>0. That is, a mass percentage of Ga in the N-type graded material layer 161 is between a mass percentage of Ga in the electron supply layer 11 and a mass percentage of Ga in the N-type transition layer 141. In the N-type graded material layer 161, in a thickness direction from the electron supply layer 11 to the N-type transition layer 141, the mass percentage of Ga may be gradually increased.

According to the materials of the electron supply layer 11, in addition to the three elements: Al, Ga and N, the materials of the N-type graded material layer 161 may include In, P and other elements.

Materials of the N electrode 151 and the P electrode 152 may be at least one of Ti, Al, Ni or Au. For example, the N electrode 151 and the P electrode 152 have a stacked structure of Ti layer/Al layer/Ni layer/Au layer, or a stacked structure of Ti layer/Al layer, or a stacked structure of Ni layer/Au layer.

Since the materials of the N-type transition layer 141 are GaN, a low contact resistance may be formed between the N electrode 151 and the N-type transition layer 141 without annealing. In addition, the electron supply layer 11 does not need to be made too thick, so that the quality of the electron supply layer 11 may be improved.

Figure 8:
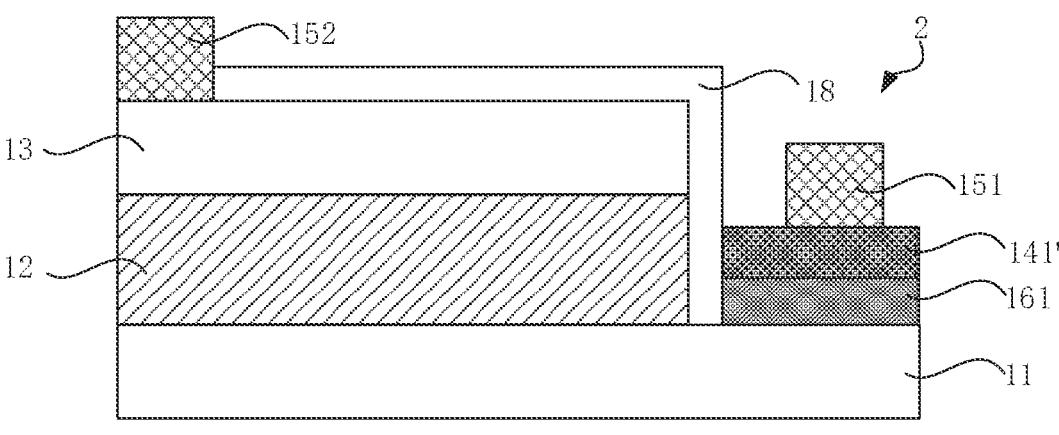
FIG. 8 is a schematic diagram illustrating a cross-sectional structure of an ultraviolet LED according to a second embodiment of the present disclosure.

FIG. 8 is a schematic diagram illustrating a cross-sectional structure of an ultraviolet LED according to a second embodiment of the present disclosure.

Referring to FIG. 8, the structure of an ultraviolet LED 2 according to the second embodiment is substantially the same as that of the ultraviolet LED 1 according to the first embodiment. Their difference lies only in that the N-type transition layer 141 is a heavily doped N-type GaN layer 141'.

The heavily doped N-type GaN layer 141' above the electron supply layer 11 may provide more electrons to participate in electricity conduction than the N-type transition layer 141 made of GaN.

In the heavily doped N-type GaN layer 141', for different N-type ions, a doping concentration may be greater than $1E19/cm^3$.

Processes for forming the heavily doped N-type GaN layer 141' may include: doping the GaN layer with N-type ions while the GaN layer grows, or after the GaN layer epitaxially grows, performing N-type ion implantation.

Figure 9:
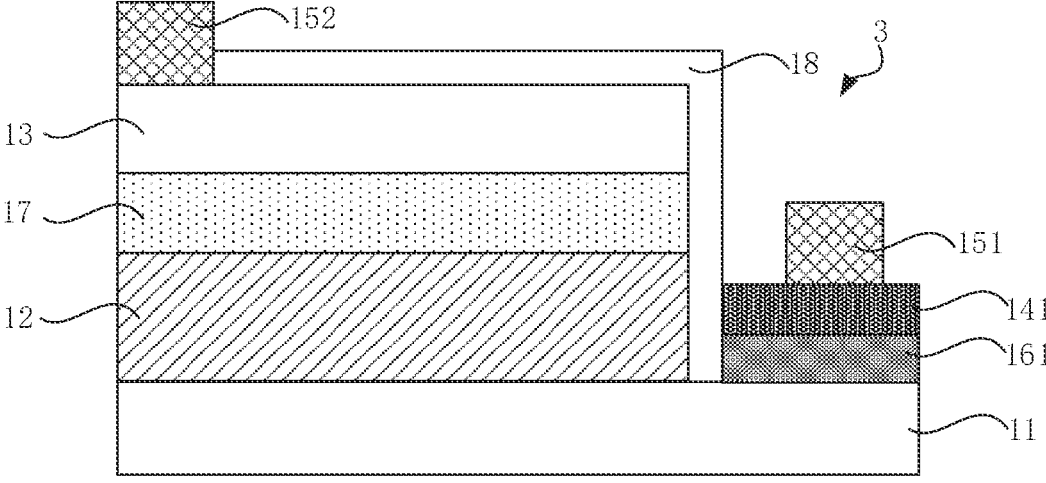
FIG. 9 is a schematic diagram illustrating a cross-sectional structure of an ultraviolet LED according to a third embodiment of the present disclosure.

FIG. 9 is a schematic diagram illustrating a cross-sectional structure of an ultraviolet LED according to a third embodiment of the present disclosure.

Referring to FIG. 9, the structure of an ultraviolet LED 3 according to the third embodiment is substantially the same as that of the ultraviolet LEDs 1 and 2 according to the first and second embodiments. Their difference lies only in that an electron blocking layer 17 is provided between the hole supply layer 13 and the active layer 12.

The electron blocking layer 17 may prevent entry of electrons from the active layer 12 to the hole supply layer 13, thereby increasing the probability of recombining electrons and holes in the active layer 12, and improving luminous efficiency. The electron blocking layer 17 may include an $Al_zGa_{1-z}N$ layer, where z is a mass percentage of Al in a sum of masses of Al and Ga, and $1 \geq z \geq 0$.

Correspondingly, the method of manufacturing the ultraviolet LED according to the third embodiment is substantially the same as that according to the first and second embodiments. Their differences lie only in that: the following step is performed between the step S2 and step S3: forming the electron blocking layer 17 on the active layer 12; at step S4, the second functional layer, the electron blocking layer 17 and the active layer 12 are patterned.

Figure 10:
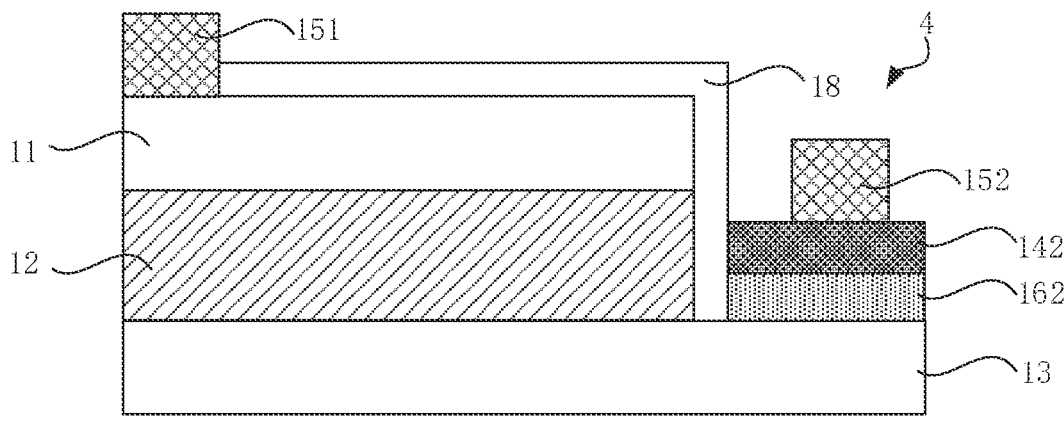
FIG. 10 is a schematic diagram illustrating a cross-sectional structure of an ultraviolet LED according to a fourth embodiment of the present disclosure.

FIG. 10 is a schematic diagram illustrating a cross-sectional structure of an ultraviolet LED according to a fourth embodiment of the present disclosure.

Referring to FIG. 10, the structure of an ultraviolet LED 4 and its manufacturing method according to the fourth embodiment are substantially the same as that of the ultraviolet LED 1 according to the first embodiment. Their differences lie only in that: the first functional layer is the hole supply layer 13; the second functional layer is the electron supply layer 11; a P-type transition layer 142 is formed above the exposed area of the first functional layer, and materials of the P-type transition layer 142 are GaN; the P electrode 152 is formed on the P-type transition layer 142, and an ohmic contact is formed between the P-type transition layer 142 and the P electrode 152; the N electrode 151 is formed on the second functional layer, and between the second functional layer and the N electrode 151 is an ohmic contact.

Referring to FIG. 10, in order to improve the quality of the P-type transition layer 142, a P-type graded material layer 162 may also be firstly formed on the exposed area of the first functional layer. Materials of the P-type graded material layer 162 may be $Al_pGa_{1-p}N$, where p is a mass percentage of Al in a sum of masses of Al and Ga, and $n > p > 0$. That is, a mass percentage of Ga in the P-type graded material layer 162 is between a mass percentage of Ga in the first functional layer and a mass percentage of Ga in the P-type transition layer 142. In the P-type graded material layer 162, in a thickness direction from the hole supply layer 13 to the P-type transition layer 142, the mass percentage of Ga may be gradually increased.

According to the materials of the hole supply layer 13, in addition to the three elements: Al, Ga and N, the materials of the P-type graded material layer 162 may include In, P and other elements.

Processes for forming the P-type graded material layer 162 may refer to the processes for forming the well layer and/or the barrier layer.

Since the materials of the P-type transition layer 142 are GaN, a low-resistance P-type ohmic contact may be formed between the P electrode 152 and the P-type transition layer

142 without annealing. In addition, the hole supply layer 13 does not need to be made too thick, so that the quality of the hole supply layer 13 may be improved.

Figure 11:
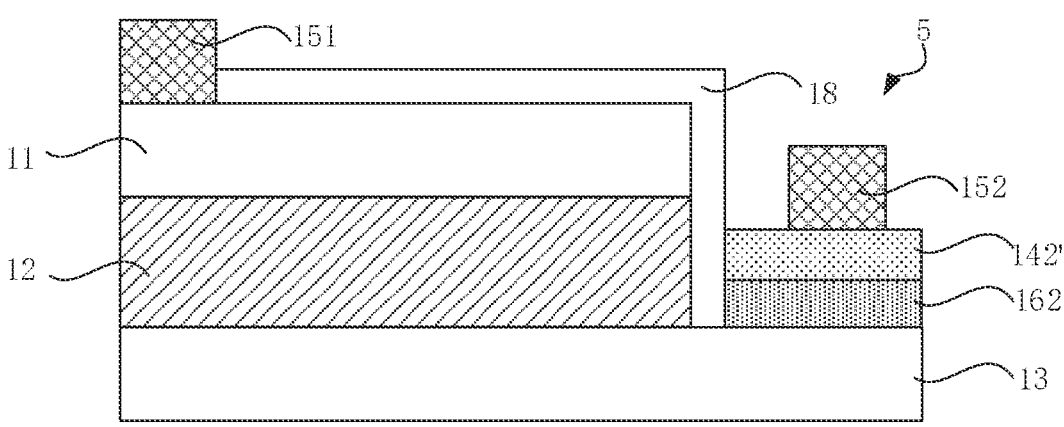
FIG. 11 is a schematic diagram illustrating a cross-sectional structure of an ultraviolet LED according to a fifth embodiment of the present disclosure.

FIG. 11 is a schematic diagram illustrating a cross-sectional structure of an ultraviolet LED according to a fifth embodiment of the present disclosure.

Referring to FIG. 11, the structure of an ultraviolet LED 5 according to the fifth embodiment is substantially the same as that of the ultraviolet LED 4 according to the fourth embodiment. Their difference lies only in that the P-type transition layer 142 is a heavily doped P-type GaN layer 142'.

The heavily doped P-type GaN layer 142' on the hole supply layer 13 may provide more holes to participate in electricity conduction than the P-type transition layer 142 made of GaN.

In the heavily doped P-type GaN layer 142', for different P-type ions, a doping concentration may be greater than $1E19/cm^3$.

Processes for forming the heavily doped P-type GaN layer 142' may include doping the GaN layer with P-type ions while the GaN layer grows, or after the GaN layer epitaxially grows, performing P-type ion implantation.

Figure 12:
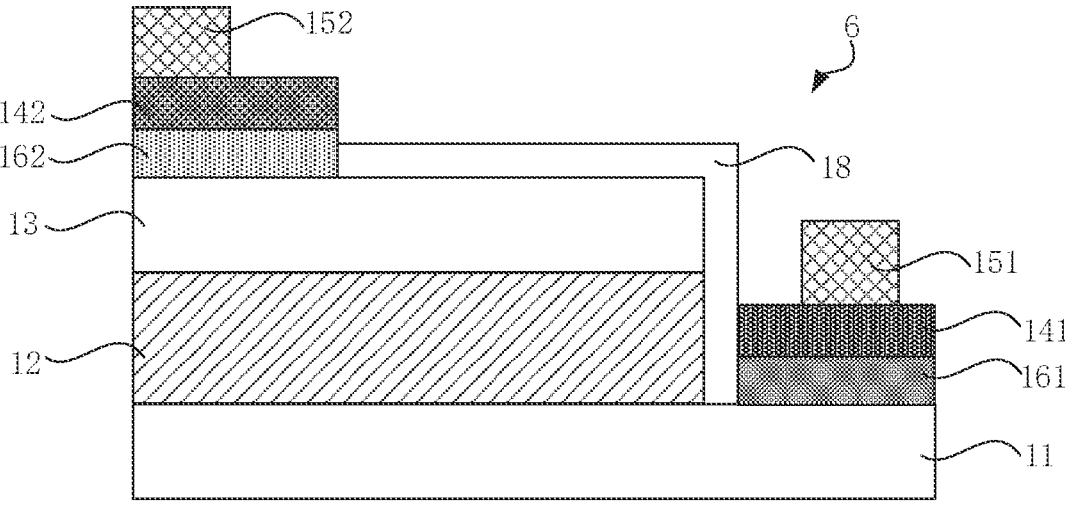
FIG. 12 is a schematic diagram illustrating a cross-sectional structure of an ultraviolet LED according to a sixth embodiment of the present disclosure.

FIG. 12 is a schematic diagram illustrating a cross-sectional structure of an ultraviolet LED according to a sixth embodiment of the present disclosure.

Referring to FIG. 12, the structure of an ultraviolet LED 6 according to the sixth embodiment is substantially the same as that of the ultraviolet LEDs 1, 2 and 3 according to the first, second and third embodiments. Their differences lie only in that: a P-type transition layer 142 is also provided above a surface of the hole supply layer 13, a P electrode 152 is provided on the P-type transition layer 142, and an ohmic contact is formed between the P-type transition layer 142 and the P electrode 152.

Correspondingly, the method of manufacturing the ultraviolet LED according to the sixth embodiment is substantively the same as that according to the first, second and third embodiments. Their differences lie only in that: at step S4, the P-type transition layer 142 is formed above the second functional layer, the N-type transition layer 141 is formed above the exposed area of the first functional layer, and materials of the P-type transition layer 142 and the N-type transition layer 141 are GaN; at step S5, an N electrode 151 is formed on the N-type transition layer 141, and an ohmic contact is formed between the N-type transition layer 141 and the N electrode 151; a P electrode 152 is formed on the P-type transition layer 142, and an ohmic contact is formed between the P-type transition layer 142 and the P electrode 152.

The P electrode 152 on the second functional layer and the N electrode 151 on the first functional layer of the ultraviolet LED 6 do not need to be annealed to form corresponding low-resistance P-type ohmic contact and low-resistance N-type ohmic contact.

Figure 13:
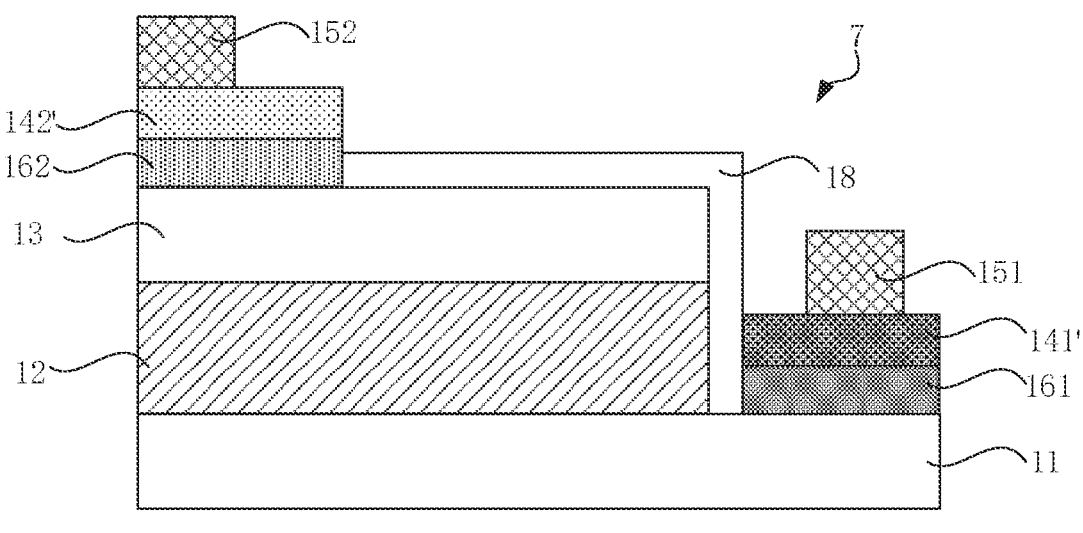
FIG. 13 is a schematic diagram illustrating a cross-sectional structure of an ultraviolet LED according to a seventh embodiment of the present disclosure.

FIG. 13 is a schematic diagram illustrating a cross-sectional structure of an ultraviolet LED according to a seventh embodiment of the present disclosure.

Referring to FIG. 13, the structure of an ultraviolet LED 7 according to the seventh embodiment is substantially the same as that of the ultraviolet LED 6 according to the sixth embodiment. Their differences lie only in that: the N-type transition layer 141 above the surface of the electron supply layer 11 is a heavily doped N-type GaN layer 141', and the P-type transition layer 142 above the surface of the hole supply layer 13 is a heavily doped P-type GaN layer 142'.

The heavily doped P-type GaN layer 142' above the hole supply layer 13 may provide more holes to participate in electricity conduction than the P-type transition layer 142 made of GaN.

Figure 14:
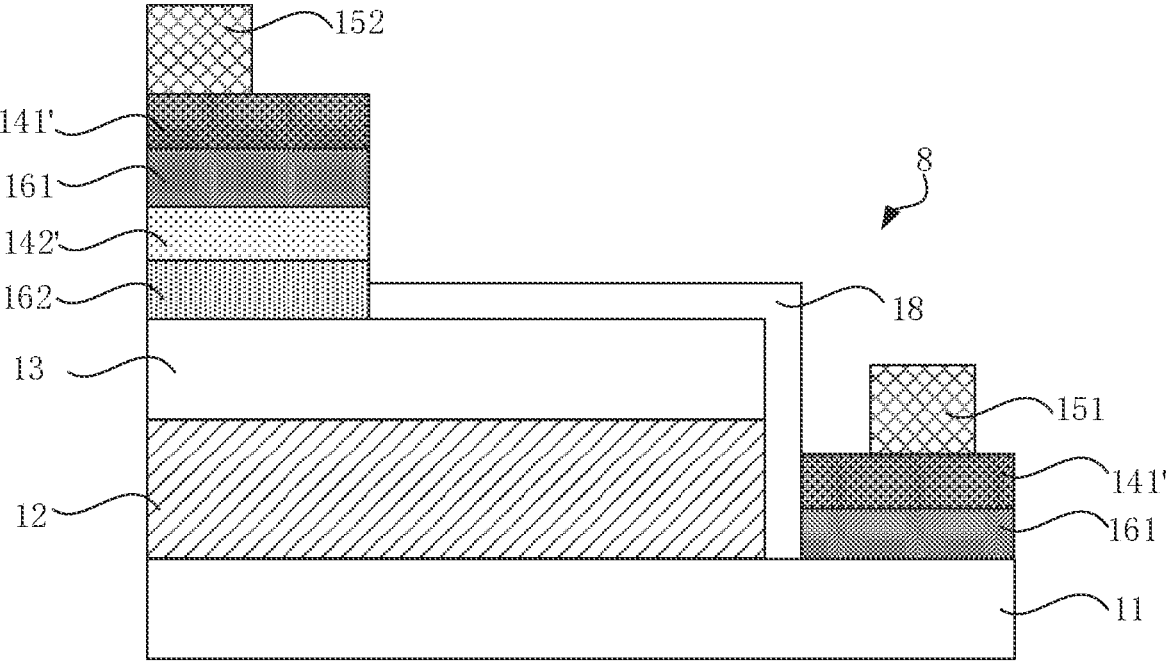
FIG. 14 is a schematic diagram illustrating a cross-sectional structure of an ultraviolet LED according to an eighth embodiment of the present disclosure.

FIG. 14 is a schematic diagram illustrating a cross-sectional structure of an ultraviolet LED according to an eighth embodiment of the present disclosure.

Referring to FIG. 14, the structure of an ultraviolet LED 8 according to the eighth embodiment is substantially the same as that of the ultraviolet LED 7 according to the seventh embodiment. Their differences lie only in that: the ultraviolet LED 8 shown in FIG. 14 further includes an N-type transition layer 161 and a heavily doped N-type GaN layer 141', where the N-type transition layer 161 is provided on the heavily doped P-type GaN layer 142', the heavily doped N-type GaN layer 141' is provided on the N-type transition layer 161, and the P electrode 152 is formed on the heavily doped N-type GaN layer 141'.

The heavily doped P-type GaN layer 142' and the heavily doped N-type GaN layer 141' may form a tunnel junction. Studies have shown that as a voltage applied between the P electrode 152 and the N electrode 151 is increased, a tunnel current of the tunnel junction is increased rapidly. The ultraviolet LED 8 according to this embodiment may form a P-type ohmic contact with a lower contact resistance through the tunnel junction.

In the method of manufacturing the ultraviolet LED 8, the N-type transition layer 161 and the heavily doped N-type GaN layer 141' on the heavily doped P-type GaN layer 142' may be manufactured with the N-type transition layer 161 and the heavily doped N-type GaN layer 141' on the electron supply layer 11 at the same time, and their processes are compatible.

In some embodiments, the N-type transition layer 161 may also be omitted, and the heavily doped P-type GaN layer 142' directly contacts the heavily doped N-type GaN layer 141' to form a tunnel junction.

Figure 15:
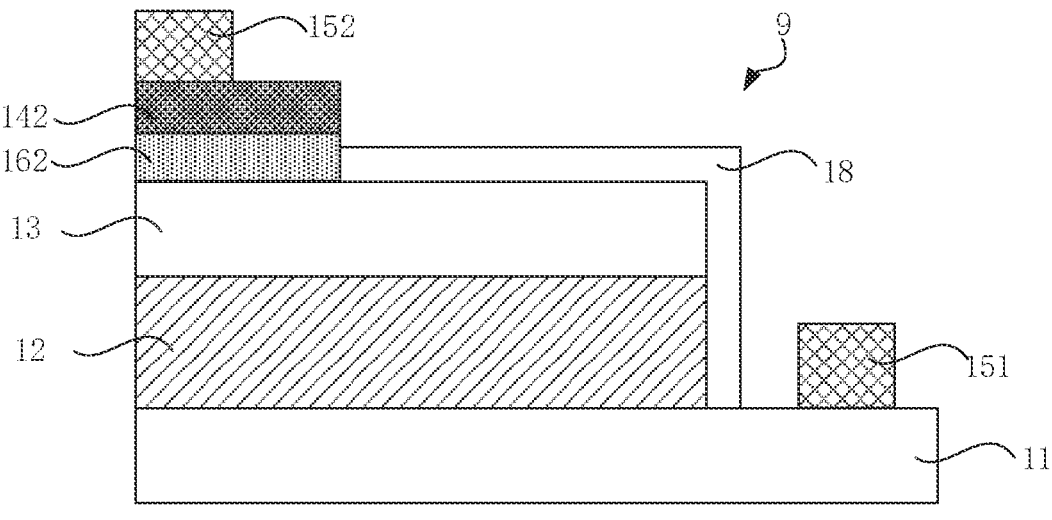
FIG. 15 is a schematic diagram illustrating a cross-sectional structure of an ultraviolet LED according to a ninth embodiment of the present disclosure.

FIG. 15 is a schematic diagram illustrating a cross-sectional structure of an ultraviolet LED according to a ninth embodiment of the present disclosure.

Referring to FIG. 15, the structure of an ultraviolet LED 9 according to the ninth embodiment is substantially the same as that of the ultraviolet LEDs 1, 2, 3, 4, 5, 6, 7 and 8 according to the first to eighth embodiments. Their differences lie only in that: a P-type transition layer 142 is only provided above the surface of the hole supply layer 13, a P electrode 152 is provided on the P-type transition layer 142, and an ohmic contact is formed between the P-type transition layer 142 and the P electrode 152.

Correspondingly, the method of manufacturing an ultraviolet LED according to the ninth embodiment is substantially the same as that according to the first to eighth embodiments. Their differences lie only in that: at step S4, a P-type transition layer 142 is formed above the second functional layer, and materials of the P-type transition layer 142 are GaN; at step S5, an N electrode 151 is formed on the first functional layer, and between the first functional layer and the N electrode 151 is an ohmic contact; a P electrode 152 is formed on the P-type transition layer 142, and an ohmic contact is formed between the P-type transition layer 142 and the P electrode 152.

The P electrode 152 on the second functional layer of the ultraviolet LED 9 does not need to be annealed to form a low-resistance P-type ohmic contact.

Figure 16:
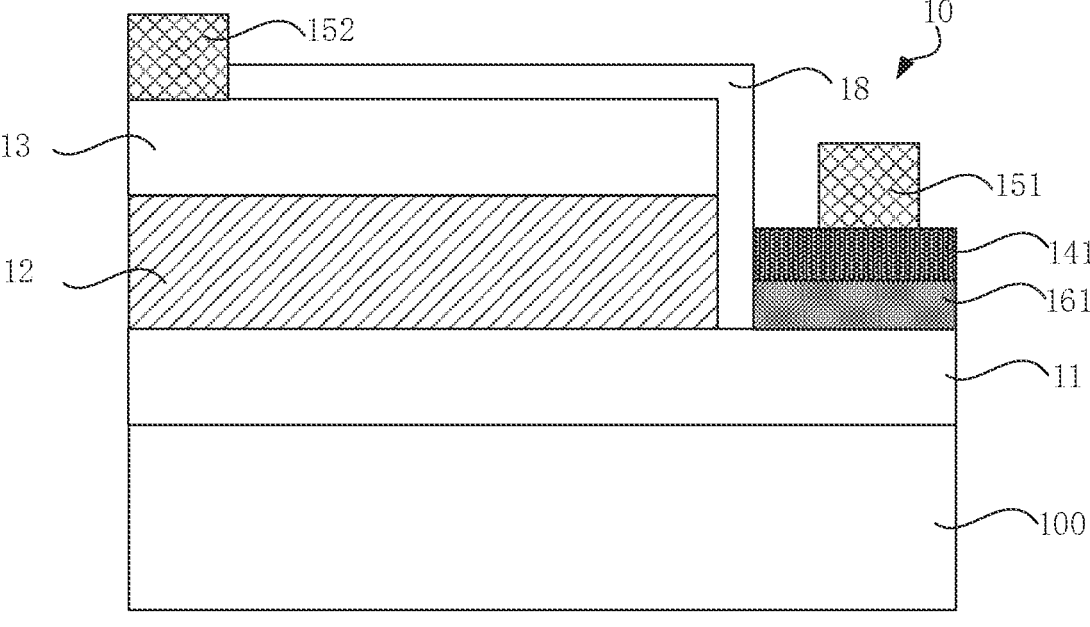
FIG. 16 is a schematic diagram illustrating a cross-sectional structure of an ultraviolet LED according to a tenth embodiment of the present disclosure.

FIG. 16 is a schematic diagram illustrating a cross-sectional structure of an ultraviolet LED according to a tenth embodiment of the present disclosure.

Referring to FIG. 16, the structure of an ultraviolet LED 10 according to the tenth embodiment is substantially the same as that of the ultraviolet LEDs 1, 2, 3, 4, 5, 6, 7, 8 and 9 according to the first to ninth embodiments. Their difference lies only in that: a substrate 100 is included.

The substrate 100 may be made of sapphire, silicon carbide, silicon, or a GaN-based material.

Correspondingly, the method of manufacturing the ultraviolet LED according to the tenth embodiment is substantially the same as that according to the first to ninth embodiments. Their differences lie only in that: at step S1, the substrate 100 is provided, and the first functional layer is formed on the substrate 100.

A method of forming the first functional layer refers to the method of forming the second functional layer.

Before the first functional layer is formed on the substrate 100, a nucleation layer and a buffer layer (not shown in figure) may be firstly formed in sequence. Materials of the nucleation layer may be AlN, AlGaN, etc., and materials of the buffer layer may include at least one of AlN, GaN, AlGaN or AlInGaN. A method of forming the buffer layer may be the same as the method of forming the first functional layer. The nucleation layer may alleviate the problem of an epitaxially grown semiconductor layer, for example, the lattice mismatch and thermal mismatch between the first functional layer and the substrate 100. The buffer layer may reduce the dislocation density and defect density of the epitaxially grown semiconductor layer, and improve crystal quality.

Although the present disclosure is disclosed as above, the present disclosure is not limited thereto. Any person skilled in the art can make various changes and modifications without departing from the spirit and scope of the present disclosure. Therefore, the protection scope of the present disclosure should be based on the scope defined by the claims.

The invention claimed is:

1. An ultraviolet LED, comprising:
an electron supply layer;
a hole supply layer;
an active layer between the electron supply layer and the hole supply layer; and
a P-type transition layer above the hole supply layer;
wherein materials of the electron supply layer and the hole supply layer comprise three elements: Al, Ga and N;
materials of the P-type transition layer comprise GaN;
a P electrode is provided above the P-type transition layer; and
an ohmic contact is formed between the P-type transition layer and the P electrode;
wherein a P-type graded material layer is provided between the hole supply layer and the P-type transition layer, wherein the P-type graded material layer comprises at least three elements: Al, Ga and N, and a mass percentage of the Ga in the P-type graded material layer is greater than a mass percentage of the Ga in the hole supply layer;
wherein the P-type transition layer is a heavily doped P-type GaN layer;
wherein a first N-type graded material layer and a heavily doped N-type GaN layer sequentially stacked on the heavily doped P-type GaN layer are provided between the heavily doped P-type GaN layer and the P electrode.

2. The ultraviolet LED according to claim 1, further comprising:

an N-type transition layer above the electron supply layer;

an N electrode is provided above the N-type transition layer; and an ohmic contact is formed between the N-type transition layer and the N electrode;

wherein materials of the N-type transition layer comprise GaN;

wherein a second N-type graded material layer is provided between the electron supply layer and the N-type transition layer, wherein the second N-type graded material layer comprises at least three elements: Al, Ga and N, and a mass percentage of the Ga in the second N-type graded material layer is greater than a mass percentage of the Ga in the electron supply layer, and the second N-type graded material layer and the first N-type graded material layer are made of the same material.

3. The ultraviolet LED according to claim 2, wherein the N-type transition layer is made of the heavily doped N-type GaN layer.

4. The ultraviolet LED according to claim 2, wherein a material of at least one of the N electrode or the P electrode is at least one of Ti, Al, Ni or Au.

5. The ultraviolet LED according to claim 2, wherein a mask layer is provided above the electron supply layer and the hole supply layer, wherein the mask layer is made of an insulating material, and an area covered by the mask layer is complementary to an area covered by the N-type transition layer or the P-type transition layer.

6. The ultraviolet LED according to claim 1, wherein material of at least one of the electron supply layer or the hole supply layer is AlGaN.

7. The ultraviolet LED according to claim 1, wherein the active layer comprises a quantum well structure.

8. The ultraviolet LED according to claim 7, wherein the quantum well structure is a multiple quantum well structure.

9. The ultraviolet LED according to claim 7, wherein the quantum well structure comprises an $Al_xGa_{1-x}N$ layer and an $Al_yGa_{1-y}N$ layer, wherein $1 \geq x \geq 0$, and $1 \geq y \geq 0$.

10. The ultraviolet LED according to claim 1, wherein an electron blocking layer is provided between the hole supply layer and the active layer.

11. A method of manufacturing an ultraviolet LED, comprising:

providing a first functional layer, wherein the first functional layer is one of an electron supply layer and a hole supply layer, and materials of the first functional layer comprise at least three elements: Al, Ga and N;

forming an active layer above the first functional layer;

forming a second functional layer above the active layer, wherein the second functional layer is another of the electron supply layer and the hole supply layer, and materials of the second functional layer comprise at least three elements: Al, Ga and N;

patterning the second functional layer and the active layer;

exposing a partial area of the first functional layer;

forming a transition layer above partial area of the first functional layer that is exposed, wherein the first functional layer is the hole supply layer, a transition layer above the hole supply layer is a P-type transition layer, and materials of the P-type transition layer are GaN; and forming a P electrode above the P-type transition layer, such that an ohmic contact is formed between the P-type transition layer and the P electrode;

wherein before the P-type transition layer is formed above the hole supply layer, a P-type graded material layer is formed firstly, the P-type graded material layer comprises at least three elements: Al, Ga and N, and a mass percentage of the Ga in the P-type graded material layer is greater than a mass percentage of the Ga in the hole supply layer;

wherein the P-type transition layer is a heavily doped P-type GaN layer;

wherein after the P-type transition layer is formed and before the P electrode is formed, the method further comprises sequentially forming a first N-type graded material layer and a heavily doped N-type GaN layer on the heavily doped P-type GaN layer.

12. The method of manufacturing an ultraviolet LED according to claim 11, wherein the second functional layer is the electron supply layer, and after forming the second functional layer, the method further comprises:

forming a transition layer above the second functional layer, wherein the transition layer above the second functional layer is an N-type transition layer; and forming an N electrode above the N-type transition layer, such that an ohmic contact is formed between the N-type transition layer and the N electrode;

wherein before the N-type transition layer is formed above the electron supply layer, a second N-type graded material layer is formed firstly, the second N-type graded material layer comprises at least three elements: Al, Ga and N, and a mass percentage of the Ga in the second N-type graded material layer is greater than a mass percentage of the Ga in the electron supply layer, and the second N-type graded material layer and the first N-type graded material layer are made of the same material.

13. The method of manufacturing an ultraviolet LED according to claim 12, wherein the N-type transition layer is made of the heavily doped N-type GaN layer.

14. The method of manufacturing an ultraviolet LED according to claim 12, wherein before the transition layer is formed above at least one of the second functional layer or the partial area of the first functional layer that is exposed, a mask layer is formed above the second functional layer and the partial area of the first functional layer that is exposed, the mask layer is made of an insulating material, and an area covered by the mask layer is complementary to an area covered by a to-be-formed transition layer.

15. The method of manufacturing an ultraviolet LED according to claim 12, wherein material of at least one of the N electrode or the P electrode is at least one of Ti, Al, Ni or Au.

16. The method of manufacturing an ultraviolet LED according to claim 11, wherein a material of at least one of the electron supply layer or the hole supply layer is AlGaN.

17. The method of manufacturing an ultraviolet LED according to claim 11, wherein the active layer comprises a quantum well structure.

18. The method of manufacturing an ultraviolet LED according to claim 17, wherein the quantum well structure is a multiple quantum well structure.

19. The method of manufacturing an ultraviolet LED according to claim 17, wherein the quantum well structure comprises an $Al_xGa_{1-x}N$ layer and an $Al_yGa_{1-y}N$ layer, wherein $1 \geq x \geq 0$, and $1 \geq y \geq 0$.

20. The method of manufacturing an ultraviolet LED according to claim 11, wherein an electron blocking layer is formed between the hole supply layer and the active layer.

\* \* \* \* \*